United States Patent
Bienvenu

(10) Patent No.: US 11,063,581 B2
(45) Date of Patent: Jul. 13, 2021

(54) TRANSISTOR CONTROL CIRCUIT

(71) Applicant: STMicroelectronics (Rousset) SAS, Rousset (FR)

(72) Inventor: Philippe Bienvenu, Saint Maximin (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/816,617

(22) Filed: Mar. 12, 2020

(65) Prior Publication Data

US 2020/0321954 A1 Oct. 8, 2020

(30) Foreign Application Priority Data

Apr. 5, 2019 (FR) ....................................... 1903689

(51) Int. Cl.
*H03K 17/08* (2006.01)
*H03K 17/06* (2006.01)
*H03K 17/16* (2006.01)
*H03K 17/12* (2006.01)

(52) U.S. Cl.
CPC ............ *H03K 17/063* (2013.01); *H03K 17/08* (2013.01); *H03K 17/122* (2013.01); *H03K 17/167* (2013.01); *H03K 2017/0806* (2013.01)

(58) Field of Classification Search
CPC ................. H03K 17/063; H03K 17/08; H03K 2017/0806; H03K 17/165; H03K 17/167; H03K 17/122; H03K 17/161; H03K 17/26; H03K 17/284; H03K 17/302
See application file for complete search history.

(56) References Cited

U.S. PATENT DOCUMENTS

| 5,949,273 | A | 9/1999 | Mourick et al. |
| 9,692,405 | B2* | 6/2017 | Na .................. H03K 17/127 |
| 2004/0252430 | A1 | 12/2004 | Oumaru et al. |
| 2006/0250742 | A1 | 11/2006 | Fichera |
| 2014/0062536 | A1 | 3/2014 | Deml et al. |
| 2015/0340890 | A1 | 11/2015 | Yao et al. |
| 2017/0149426 | A1 | 5/2017 | Na et al. |
| 2018/0145672 | A1 | 5/2018 | Shimizu et al. |

FOREIGN PATENT DOCUMENTS

DE 102016121854 A1 5/2017

OTHER PUBLICATIONS

Castellazzi, A., et al.,"SiC power MOSFETs performance, robustness and technology maturity", Elsevier, www.elsevier.com/locate/mr, Microelectronics Reliability, 58, Feb. 13, 2016, 13 pages.
Fairchild Semiconductor, "Practical Considerations of Trench MOSFET Stability", Analog Design, www.eeweb.com/practical-considerations-of-trench-mosfet-stability, Apr. 1, 2013, 11 pages.
Shue, J. L., et al., "Power MOSFET Thermal Instability operation characterization support", Report NASA/TM-2010-216684, https://ntrs.nasa.gov/archive/nasa/casi.ntrs.nasa.gov/20100014777.pdf, Apr. 2010, 23 pages.

* cited by examiner

*Primary Examiner* — Jung Kim
(74) *Attorney, Agent, or Firm* — Slater Matsil, LLP

(57) ABSTRACT

A method includes simultaneously controlling several transistors by a first signal and separately controlling the transistors by distinct second pulsed signals.

24 Claims, 5 Drawing Sheets

TRANSISTOR CONTROL CIRCUIT

CROSS-REFERENCE TO RELATED APPLICATIONS

This application claims priority to French Patent Application No. 1903689, filed on Apr. 5, 2019, which application is hereby incorporated herein by reference.

TECHNICAL FIELD

The present description generally relates to electronic circuits, and more particularly a transistor control circuit.

BACKGROUND

In certain applications, a transistor is used to switch a current in a load and/or a voltage across the terminals of the load. Such a transistor is for example a field effect transistor, for example of the MOS type. The transistor control circuit is used to apply a control signal to a control terminal of the transistor, such as the gate of the field effect transistor.

SUMMARY

Embodiments improve the known transistor control methods and circuits, in particular during a change of the on/off state of the transistor, more particularly when the load is inductive.

Embodiments overcome all or some of the drawbacks of the known transistor control circuits.

Embodiments provide limiting the risks of overheating of a transistor during a change of the on/off state of the transistor.

Further embodiments provide a method comprising the simultaneous control of several transistors by a same first signal, and the separate control of said transistors by second distinct signals repeated in pulses.

Various other embodiments provide a circuit configured for the simultaneous control of several transistors by a same first signal, and for the control of said transistors separately by second distinct signals repeated in pulses.

According to one embodiment, in a first phase, the state of each of said transistors is controlled, as a function of one of the second signals, between an off state and a state in which a predefined potential is applied to the control terminal of the transistor.

According to one embodiment, for each of said transistors, the predefined potential is strictly between the potentials of the conduction terminals of the transistor.

According to one embodiment, the first phase is implemented only when a voltage across control and conduction terminals of said transistors is above a threshold.

According to one embodiment, in a second phase, the on/off state of at least one of said transistors depends only on the first signal.

According to one embodiment, switches are each coupled to a control terminal of one of said transistors and are controlled by the second signals.

According to one embodiment, first conduction terminals of the transistors are coupled together to the switches by a first diode.

According to one embodiment, the first diode is a Zener diode.

According to one embodiment, the first diode is electrically in series with a second diode.

According to one embodiment, said switches couple the first diode to the respective control terminals of said transistors.

According to one embodiment, for each of said transistors, said switch couples the control terminal to a second conduction terminal of the transistor and is coupled to the first diode by a resistive element.

According to one embodiment, each of said switches is electrically in parallel with an additional diode, preferably a Zener diode.

According to one embodiment, additional switches are controlled by the first signal and are each coupled to one of the control terminals of said transistors.

One embodiment provides a device configured to implement a method as defined above, or comprising a circuit as defined above.

According to one embodiment, said transistors are electrically in parallel between a node for applying a supply potential and an inductive element.

BRIEF DESCRIPTION OF THE DRAWINGS

These features and advantages, as well as others, will be described in detail in the following description of specific embodiments done non-limitingly in connection with the attached figures, in which.

DETAILED DESCRIPTION OF ILLUSTRATIVE EMBODIMENTS

Same elements have been designated by same references in the various figures. In particular, the structural and/or functional elements shared by the various embodiments may have the same references and can have identical structural, dimensional and material properties.

For clarity reasons, only the steps and elements useful to understand the described embodiments have been shown and are described. In particular, a circuit for switching a transistor to the on state when a signal is received by the circuit at a given level, for example a high level, is not described in detail, the described embodiments being compatible with such a standard circuit. Furthermore, the structures of the transistors, in particular the structures of transistors composed of several transistors in parallel, are not outlined, the described embodiments being compatible with such standard transistors.

Unless otherwise specified, when reference is made to two elements connected to one another, this means directly connected with no intermediate elements other than conductors, and when reference is made to two elements linked or coupled to one another, this means that these two elements can be connected or be linked or coupled by means of one or several other elements.

In the following description, when reference is made to absolute position qualifiers, such as the terms "front", "rear", "top", "bottom", "left", "right", etc., or relative position qualifiers, such as "top", "bottom", "upper", "lower", etc., or orientation qualifiers, such as the terms "horizontal", "vertical", etc., reference is made, unless otherwise specified, to the orientation of the figures.

Unless otherwise specified, the expressions "about," "approximately," "substantially" and "on the order of" mean to within 10%, preferably to within 5%.

Figure 1:
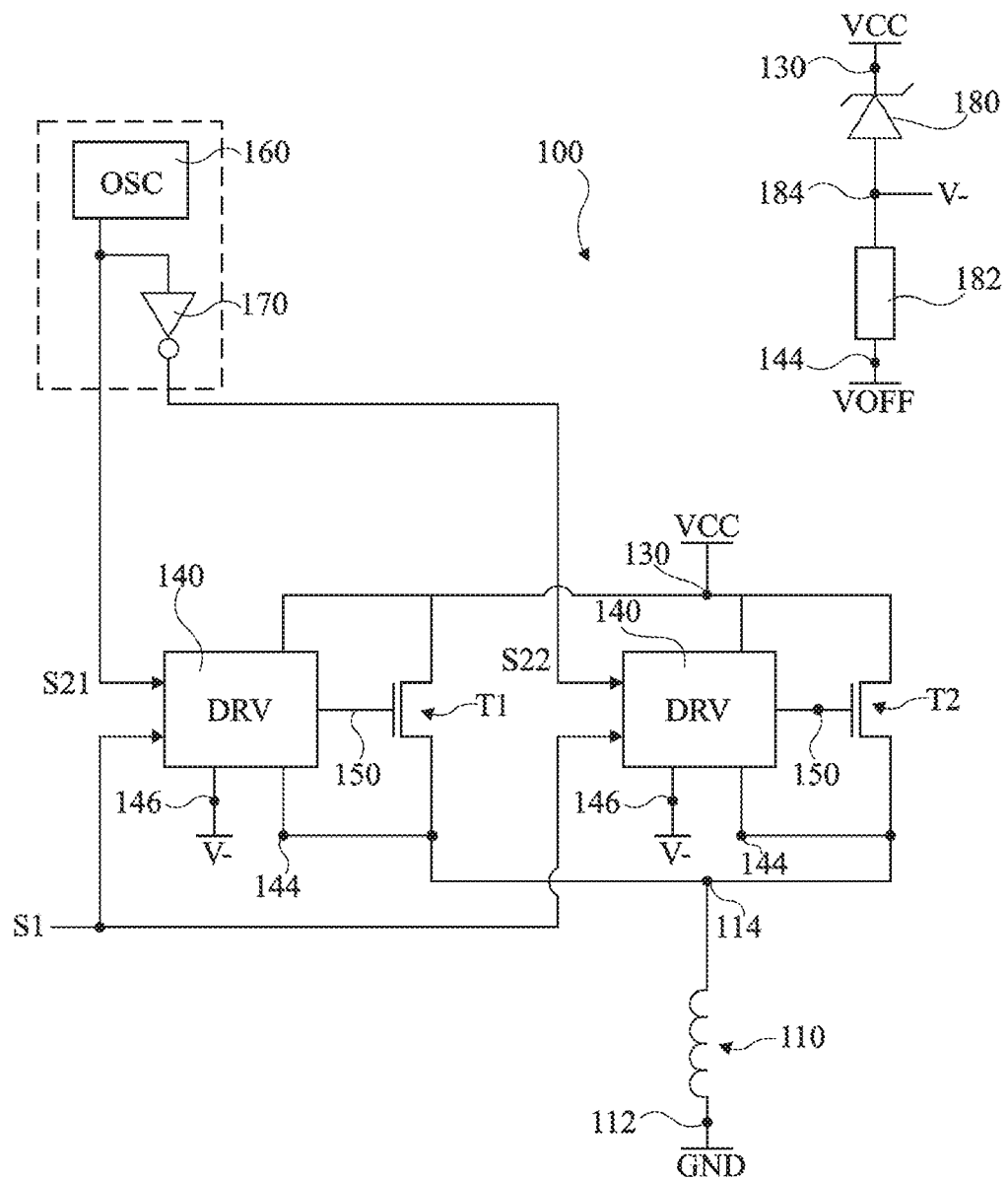
FIG. 1 schematically shows one embodiment of a device for switching a load.

FIG. 1 schematically shows one embodiment of a device 100 for switching a load 110. In this embodiment, the load 110 is an inductive element.

The device 100 makes it possible to apply, to the terminals 112 and 114 of the load 110, a supply voltage, for example referenced at the ground GND, as a function of the level of a signal S1. The supply voltage is supplied to the device 100 between a node 130 for application of a supply potential VCC and the terminal 112 of the load, the terminal 112 for example constituting a node for applying a reference potential. The device 100 is typically used in applications such as automotive applications, in which the supply voltage corresponds to that of a battery. The load is then for example comprised in a piece of equipment, for example an electrical energy converter or an electric motor. The supply voltage is typically between 10 V and 100 V, for example on the order of 12 V or on the order of 48 V.

The device 100 comprises two transistors T1 and T2. Preferably, the transistors T1 and T2 are electrically in parallel between the terminal 114 of the load 110 and the node 130 for applying the potential VCC. The association in parallel of the transistors T1 and T2 is thus in series with the load between the nodes 130 and 112 for applying the supply voltage. The transistors T1 and T2 are preferably field-effect transistors, for example of the MOS type. Each transistor T1, T2 can be made up of several transistors electrically in parallel, the control terminals of which are connected to one another. Preferably, the transistors T1 and T2 have channel N, and the potential VCC is positive. In a variant, the transistors T1 and T2 have channel P, and the potential VCC is negative.

The transistors T1 and T2 are controlled simultaneously, that is to say, together, as a function of the control signal S1. In other words, the control signal S1 is the same signal for the transistors T1 and T2. To that end, for each transistor T1, T2, the device 100 comprises a control circuit 140 (DRV) of the gate 150 of the transistor as a function of the signal S1. The circuits 140 receive the same signal S1 and are each coupled, preferably connected, to the gate 150 of the concerned transistor T1, T2.

Each circuit is configured to supply a potential VON. The application of the potential VON to the gate 150 of the concerned transistors T1, T2 places this transistor in the on state. Each circuit 140 is coupled, preferably connected, to a node 144 for applying a potential VOFF. The application of the potential VOFF to the gate 150 of one of the transistors T1, T2 places this transistor in the off state.

In the illustrated example, each circuit 140 is coupled, preferably connected, to the node 130 for applying the potential VCC. Preferably, the potential VON is greater than that of the drain of the transistor. Preferably, the potential VON is generated by each circuit 140 from the potential VCC by a charge pump. In a variant, the potential VON is supplied to the circuits 140, for example by a common circuit, not shown. The potential VON associated with each transistor T1, T2 can be any potential able to make the transistor on when it is applied to the gate of the transistor.

In the illustrated example, the node 144 of each circuit 140 is coupled, preferably connected, to the source of the concerned transistor T1, T2. The potential VOFF here is therefore that of the source of the transistor. This example is not limiting, and the potential VOFF associated with each transistor T1, T2 can be any potential able to make the transistor off when it is applied to the gate of the transistor.

In this embodiment, each circuit 140 is furthermore coupled to a node 146 for applying a potential V−. The potential V− is applied to the gates of the transistors by the circuits 140 as a function of control signals S21 and S22 received by the circuits 140 associated with the respective transistors T1 and T2. The transistors T1 and T2 are controlled in a dissociated manner, i.e., individually or separately, the signals S21 and S22 being distinct for the two transistors. The signals S21 and S22 are repetitive in pulses, that is to say, they comprise a repeated alternance of a low logic level and a high logic level. Preferably, the low and high levels are repeated regularly. Preferably, the duration of the pulses is close to that between the pulses, for example these durations are equal.

The signals S21 and S22 are opposite, that is to say that each of the signals S21 and S22 is in the high logic state when the other of the signals S21 and S22 is in the low logic state. Preferably, the signal S21 is provided by an oscillator 160 (OSC). The output of the oscillator 160 is then preferably coupled, for example connected, the input of an inverter 170. The inverter 170 receives the signal S21 and supplies the signal S22.

Each circuit 140 is configured to apply the potential VON on the gate 150 when the signal S1, or first signal, is at the high logic level. When the first signal S1 is at the low logic level, each circuit 140 applies, on the gate 150:
   if the second signal S21, S22 is at the high logic level, the potential V−; and
   if the second signal S21, S22 is at the low logic level, the potential VOFF.

Preferably, the potential V− is supplied by a Zener diode 180 and a resistive element 182 in series between the node 130 for applying the potential VCC and the node 144 for applying the potential VOFF. The potential V− is then supplied on the node 184 that connects the diode 180 and the resistive element 182 in series. The node 184 is coupled, preferably connected, to the node 146 (connection not shown). In the case of a positive potential VCC, the cathode of the diode 180 is coupled, preferably connected, to the node 130 for applying the potential VCC. In the preferred case of transistors in parallel between the node 130 and the terminal 114 of the load 110, the Zener diode 180 and the potential V− can be shared for the transistors T1 and T2.

The potential V− thus obtained is strictly between the potentials of the conduction terminals of the transistors. Preferably, the difference between the potentials VCC and V− is greater, in absolute value, than the supply voltage applied between the node 130 and the ground. Thus, for a positive supply voltage VCC, the potential V−, referenced relative to the ground, is negative. Furthermore, the potential V− is generated and applied to the node 146 only when the voltage across the conduction terminals of the transistor is above the threshold of the Zener diode 180.

In place of the diode 180 and the resistive element 182, it is possible to use any circuit making it possible to generate and apply the potential V− to the node 146, preferably only when the voltage across the conduction terminals of the transistor is above a threshold.

Figure 2:
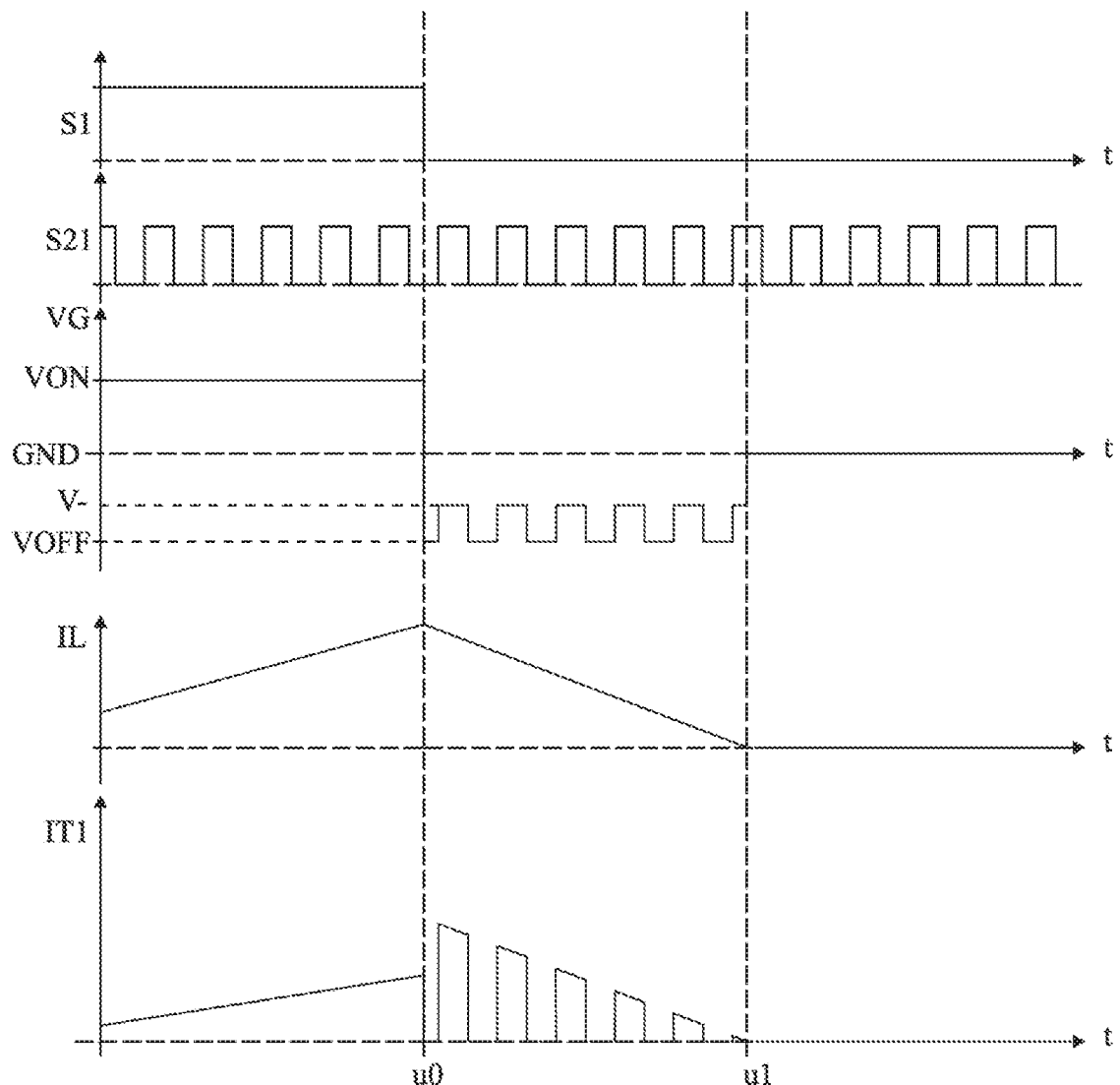
FIG. 2 is a timing diagrams schematically showing, as a function of time, an operating example of the device of FIG. 1.

FIG. 2 is a timing diagrams schematically showing, as a function of time t, in an operating example of the device 100 of FIG. 1, the signal S21, the voltage VG of the gate 150 of the transistor T1, the current IL in the load 110, and the current IT1 in the transistor T1.

In this example, the signal S1 is at the high level before a moment u0 and at the low level after the moment u0.

In an operating phase before the moment u0, the potential VON is applied to the gates 150 of the transistors T1 and T2, irrespective of the level of the second signals S21 and S22. The transistors are in the on state. The current IL in the load 110 increases. The current in each transistor T1, T2 corresponds to a part of the current IL. For example, the transistors T1 and T2 are identical, and the current in each of the transistors T1 and T2 is equal to half of the current IL.

Another operating phase is implemented after the moment u0. During this phase, when the signal S21 is at the high level, the potential V− is applied to the gate of the transistor T1, and the potential VOFF is applied to that of the transistor T2. Similarly, when the signal S21 is at the low level, the potential V− is applied to the gate of the transistor T2, and the potential VOFF is applied to the gate of the transistor T1. The difference between the potentials V− and VOFF makes it possible, for each transistor T1, T2, to allow the current IL to pass in the transistor when the potential V− is applied to its gate. Due to the presence of the current IL in the inductive load 110, the potential VOFF of the terminal 114 of the load has a more negative value than the negative potential V−. This causes a decrease of the current IL in the load 110. The current IL cancels itself out at a moment u1.

Thus, the application of the potential V− alternatively on the gate of the transistor T1 and on the gate of the transistor T2 makes it possible, after the passage of the signal S1 to the low state, to reduce the current IL in the load 110, for example until cancellation of the current IL.

Preferably, after the moment u0, when the signal S21 goes to the low level, the potential V− is first applied to the gate of the transistor T2, then the potential VOFF is applied to the gate of the transistor T1. Likewise, when the signal S21 goes from the high level to the low level, the potential V− is applied to the gate of the transistor T1, then the potential VOFF is applied to the gate of the transistor T2. One thus prevents both of the transistors T1 and T2 from being off at the same time.

To reduce the current in the load, one could have thought to use, in series with the load, a single transistor replacing the transistors T1 and T2, for example a transistor with twice the size of the size of the transistors T1 and T2. After the passage of the signal S1 to the low logic state, one would then have applied the potential V− to the gate of the transistor to cancel out the current in the load. However, the passage in the transistor of the current circulating in the load would have risked causing thermal instability in the transistor. Such thermal instability can occur when the voltage across the conduction terminals of the transistor is high, for example greater than 10 V, or even greater than 100 V. The thermal instability can occur when the transistor is subject to a high current density, for example greater than 1 A/mm². The thermal instability consists of the appearance of hot spots in the transistor, capable of damaging or destroying the transistor without leaving the time or possibility for protection means to detect overheating of the transistor.

In the device 100, between the moments u0 and u1, when the signal S21 is at a high level, all of the current circulating in the load passes through the transistor T1. When the signal S21 is at a low level, no current passes in the transistor T1. Likewise, the current in the transistor T2 alternates between the nil value and the value of the current in the load 110. The inventors have remarked that, for each transistor T1 or T2 alternatively subject to a nil current and the current circulating in the load, the risk of thermal instability is more reduced than if this transistor was subject continuously to half of the current circulating in the load. Preferably, the duration of each of the pulses of the signal S21 and S22 is lower than the time taken by a thermal instability to develop in the transistor. One thus avoids the risk of thermal instability. To that end, the frequency of the signals S21 and S22 is for example greater than 5 kHz, preferably between 5 kHz and 20 kHz.

In another phase after the moment u1, the current in the load 110 is nil, and the potential of the terminal 114 is nil. In the illustrated example, the potential V− is no longer applied to the gates 150 of the transistors T1 and T2. In this example, the potential V− is not generated in the absence of current in the load 110. In this phase, the on/off state of the transistors then only depends on the signal S1, like before the moment u0.

Although one specific embodiment for generation of the voltage V− has been described above, any standard generator can be used. For example, the potential V− can continue to be generated and applied to the gates of the transistors after the moment u1, this leaving the transistors in the off state. In a variant, the potential V− is generated in each circuit 140, for example each circuit 140 comprises a Zener diode in series with a resistive element between the conduction terminals of the concerned transistor, and the potential V− is that of the connection node between the Zener diode and the resistive element.

Although an embodiment has been described above comprising two transistors T1 and T2, other embodiments comprise more than two transistors Ti. The gate, or control terminal, of each transistor Ti is connected to a circuit 140. The circuits 140 receive the same signal S1, and receive signals S2i in pulses that are phase-shifted relative to the others. Preferably, the phases of the signals S2i are distributed uniformly between 0 and 360 degrees. When the signal S1 is at the high level, each circuit 140 applies the potential VON on the gate 150. When the first signal S1 is at the low level, each circuit 140 applies, on the gate 150:
  if the second signal S2i received by the circuit 140 is at the high level, the potential V−; and
  if the second signal S2i received by the circuit 140 is at the low level, the potential VOFF.

In an application such as the supply of an inductive load, the transistors Ti are then electrically in parallel, and the association in parallel of the transistors is in series with the load between application nodes for the supply voltage.

In the described embodiments, in each of the signals S1 and S2i, the high and low logic levels can be replaced by any pair of different first and second levels. Preferably, the first and second logic levels are the same for all of the signals S2i. Furthermore, an operation similar to that described above can be obtained by swapping the signs of the potentials and the types of conductivity N and P of the transistors.

Figure 3:
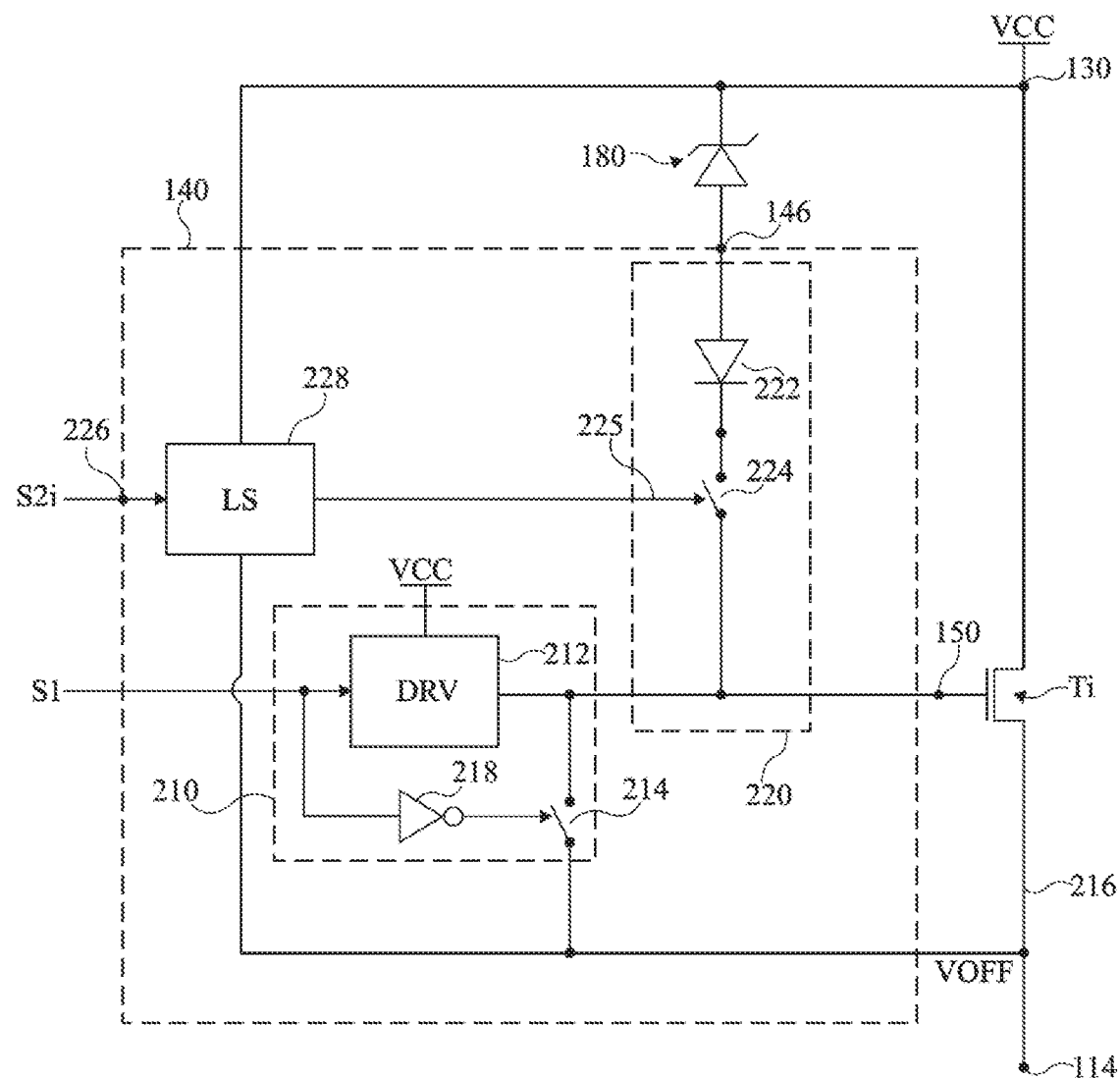
FIG. 3 schematically shows an exemplary embodiment of a circuit of the device of FIG. 1.

FIG. 3 schematically shows an exemplary embodiment of one of the circuits 140 of the device of FIG. 1, coupled to the Zener diode 180 and controlling the gate 150 of a transistor Ti.

The circuit 140 comprises a circuit 210 for controlling the transistor Ti as a function of the signal S1. The circuit 210 in particular comprises a circuit 212 (DRV) for applying the voltage VON to the gate 150 of the transistor Ti when the signal S1 is at a first level, for example a high level. The circuit 210 further comprises a switch 214 coupling the gate 150 to the node for applying the potential VOFF, here a conduction terminal 216 of the transistor Ti. The terminal 216 is for example coupled, preferably connected, to the terminal 114 of the load 110 (FIG. 1). The switch 214 is commanded by the output of an inverter 218 that receives, on its input, the signal S1. Preferably, the switch 214 is a field-effect transistor, for example of the MOS type.

The circuit 140 further comprises a circuit 220 for controlling the transistor T1 as a function of the signal S2i. In this example, the circuit 220 comprises a diode 222 and a switch 224 that are coupled in series, preferably connected in series, between the node 146 and the gate 150. Preferably, the anode of the diode 222 is connected to the node 146. Preferably, the switch 224 is a field-effect transistor, for example of the MOS type. A control terminal 225 of the switch 224 is coupled to an input node 226 of the signal S2i. In this example, the node 226 and the control terminal 225 are connected to one another by a leveling circuit (LS) 228. The circuit 228 makes it possible to apply, to the control terminal 225, voltage levels making it possible to place the switch 224 in the on state when the signal S2i is at a first level, and in the off state when the signal S2i is at a second level. As an example, the circuit 228 applies, on the terminal 225, the potential VCC when the signal S2i is in the high logic state, and the potential VOFF when the signal S2i is in the low logic state.

In the illustrated example, the Zener diode 180 and the node 146 are shared by all of the circuits 140. The diode 222 can be shared by all of the circuits 140 or can be distinct in each circuit 140.

In one variant, the circuit 228 is omitted, and the control terminal 225 and the input node 226 are connected to each other. The levels of the signal S2i are chosen to place the switch 224 respectively in the on state and in the off state when the signal S2i is applied directly to the terminal 225. To that end, the circuit generating the signal S2i (oscillator 160, FIG. 1) can then comprise a leveling circuit.

During operation, in a phase where the signal S1 is at a first level, for example the high level, the switches 214 of all of the circuits 140 are in the off state, and the circuits 212 place the transistors Ti in the on state.

In another phase where the signal S1 is at a second level, for example the low level, the switches 214 of all of the circuits 140 are in the on state, and the circuits 212 for example do not apply any potential to the gates 150 of the transistors Ti. In this phase, when the signal S2i is at a first level, the concerned switch 224 is in the off state. Thus, the potential VOFF is applied to the gate 150 of the concerned transistor Ti. In this phase, when the signal S2i is at a second level, the switches 214 and 224 are in the on state. The resistances of the switches 214 and 224 in the on state are chosen so that the potential applied to the gate 150 is then the predefined potential V−. To that end, it will be possible to provide a resistive element in series with one and/or the other of the switches 224 and 214. The resistive element 182 (FIG. 1) can be omitted, and its role played by the switches 224 and 214.

Figure 4:
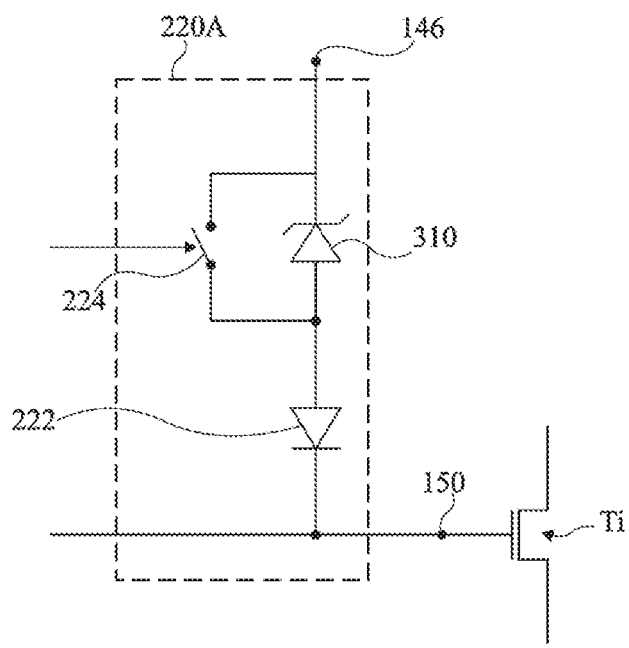
FIG. 4 schematically shows an embodiment variant of a control circuit of a transistor as a function of a control signal.

FIG. 4 schematically shows an embodiment variant of a control circuit 220A of a transistor Ti as a function of the signal S2i. The circuit 220A can replace the circuit 220 in the circuit 140 of FIG. 3. The circuit 220A comprises elements shared with the circuit 220 of FIG. 3, and only the differences between the circuits 220A and 220 are highlighted here.

The circuit 220A differs from the circuit 220 of FIG. 3 in that the positions of the switches 224 and the diode 222 have been swapped, and in that the circuit 220A further comprises a Zener diode 310 in parallel with the switch 224. The cathode of the diode 222 is coupled, preferably connected, to the gate 150, and its anode is coupled, preferably connected, to that of the Zener diode 310. The cathode of the Zener diode 310 is coupled to the node 146.

Figure 5:
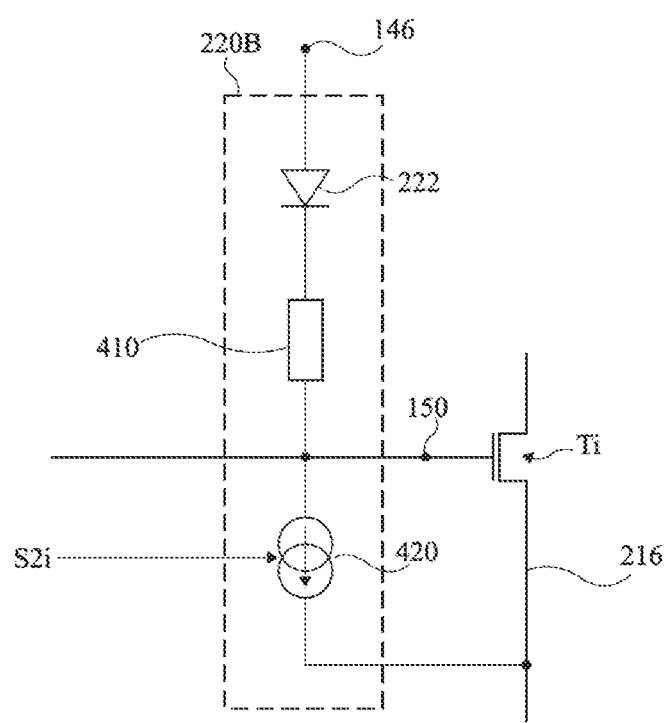
FIG. 5 schematically shows another embodiment variant of a control circuit of a transistor as a function of a control signal.

FIG. 5 schematically shows another embodiment variant of a control circuit 220B of the transistor Ti as a function of the signal S2i. The circuit 220B can replace the circuit 220 in the circuit 140 of FIG. 3.

The circuit 220B comprises the diode 222 and a resistive element 410 that are coupled in series, preferably connected in series, between the node 146 and the gate 150. As an example, the anode of the diode 222 is connected to the node 146, and the resistive element 410 is connected to the gate 150. The circuit 220B further comprises a current source 420 controlled by the signal S2i. The current source 420 couples the gate 150 to the conduction terminal 216 of the transistor Ti.

During operation, when the signal S2i is at a first level, the source 420 withdraws a current from the gate 150. The value of the withdrawn current and the resistance of the element 410 are chosen so that the gate 150 is then at a potential that takes the transistor Ti to the off state (potential VOFF). When the signal S2i is at a second level, the source 420 does not take current from the node 150. The resistance of the element 410 and the switch 214 (FIG. 3) are chosen such that the potential of the gate then corresponds to the predefined potential V−. Preferably, the current source 420 comprises, for example is composed of, a switch coupling the gate 150 to the conduction terminal 216 of the transistor Ti, for example the source 420 is a field-effect transistor, for example of the MOS type.

Various embodiments and variants have been described. One skilled in the art will understand that certain features of these different embodiments and variants could be combined, and other variants will appear to one skilled in the art.

Lastly, the practical implementation of the described embodiments and variants is within the reach of one skilled in the art from functional indications provided above.

What is claimed is:

1. A method comprising:
simultaneously controlling several transistors by a first signal; and
in a first phase, separately controlling the several transistors by distinct respective second pulsed signals, wherein the several transistors are in an on state when the first signal is in a first state, and wherein the several transistors alternate between a resistively on state and an off state based on their respective second pulsed signals when the first signal is in a second state different from the first state, wherein the resistively on state is different from the on state.

2. The method according to claim 1, wherein, in the first phase, a predefined potential is applied to a respective control terminal of a respective transistor of the several transistors when the respective transistor is in the resistively on state.

3. The method according to claim 2, wherein the predefined potential is between potentials of conduction terminals of the respective transistor.

4. The method according to claim 2, wherein the first phase is implemented only when a voltage across the respective control terminal and respective conduction terminals for each transistor is above a threshold.

5. The method according to claim 2, wherein, in a second phase, an on/off state of at least one of the several transistors depends only on the first signal.

6. The method according to claim 1, wherein switches are coupled to a respective control terminal of a respective transistor, and wherein the switches are controlled by one of the second pulsed signals.

7. The method according to claim 6, wherein a first respective conduction terminal of the respective transistor is coupled to the switches by a first diode.

8. The method according to claim 7, wherein the first diode is a Zener diode.

9. The method according to claim 7, wherein the first diode is electrically coupled in series with a second diode.

10. The method according to claim 7, wherein the switches couple the first diode to the respective control terminal of the respective transistor.

11. The method according to claim 7, wherein a second switch of the switches couples the respective control terminal to a second respective conduction terminal of the respective transistor.

12. The method according to claim 7, wherein each switch is electrically coupled to an additional diode in parallel.

13. The method according to claim 7, wherein additional switches are controlled by the first signal, and wherein each additional switch is coupled to the respective control terminal of the respective transistor.

14. A circuit configured to:
simultaneous control several transistors by a first signal; and
in a first phase, separately control the transistors by distinct respective second pulsed signals, wherein the several transistors are configured to be in an on state when the first signal is in a first state, and wherein the several transistors are configured to alternate between a resistively on state and an off state based on their respective second pulsed signals when the first signal is in a second state different from the first state, wherein the resistively on state is different from the on state.

15. The circuit according to claim 14, wherein each transistor of the circuit has a control terminal, wherein switches are coupled to the control terminal, and wherein the switches are controlled by one of the second pulsed signals.

16. The circuit according to claim 15, wherein each transistor comprises a first conduction terminal, wherein the first conduction terminal is coupled to the switches by a first diode, and wherein the switches couple the first diode to the control terminal.

17. The circuit according to claim 16, wherein a second switch of the switches couples the control terminal to a second conduction terminal of the transistor.

18. The circuit according to claim 16, wherein the first diode is electrically coupled in series with a second diode.

19. The circuit according to claim 15, wherein each switch is electrically coupled to an additional diode in parallel.

20. A device comprising:
the circuit according to claim 14,
wherein the transistors are electrically coupled between a supply node and an inductive element.

21. The method according to claim 11, wherein the second switch is coupled to the first diode via a resistive element.

22. The circuit according to claim 17, wherein the second switch is coupled to the first diode via a resistive element.

23. A method comprising:
receiving a first signal;
receiving second and third signals, the second signal being different than the third signal;
when the first signal is in a first state of the first signal, causing first and second transistors to be in an on state, the first and second transistors coupled between a supply terminal and a load terminal; and
when the first signal is in a second state of the first signal, causing the first transistor to be in a resistively on state when the second signal is in a first state of the second signal, and in an off state when the second signal is in a second state of the second signal, and
causing the second transistor to be in a resistively on state when the third signal is in a first state of the third signal, and in an off state when the third signal is in a second state of the third signal.

24. The method according to claim 23, further comprising generating the third signal by inverting the second signal.

* * * * *